(12) United States Patent
Zhou et al.

(10) Patent No.: US 8,245,765 B2
(45) Date of Patent: Aug. 21, 2012

(54) HEAT DISSIPATION DEVICE

(75) Inventors: Shi-Wen Zhou, Shenzhen (CN);
Chun-Chi Chen, Taipei Hsien (TW)

(73) Assignees: Fu Zhun Precision Industry (Shen Zhen) Co., Lt., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1024 days.

(21) Appl. No.: 12/200,874

(22) Filed: Aug. 28, 2008

(65) Prior Publication Data
US 2009/0301694 A1 Dec. 10, 2009

(30) Foreign Application Priority Data
Jun. 4, 2008 (CN) .......................... 2008 1 0067579

(51) Int. Cl.
*F28D 15/00* (2006.01)
*H05K 7/20* (2006.01)
*F25D 23/12* (2006.01)

(52) U.S. Cl. ................ 165/104.33; 361/700; 361/697; 62/259.2

(58) Field of Classification Search ............ 165/85, 165/80.3, 104.33, 185, 80.4; 361/699, 700, 361/694, 697
See application file for complete search history.

(56) References Cited

U.S. PATENT DOCUMENTS

| | | | | |
|---|---|---|---|---|
| 4,745,354 A * | 5/1988 | Fraser | ...................... | 62/259.2 |
| 5,383,340 A * | 1/1995 | Larson et al. | ............... | 62/259.2 |
| 5,634,351 A * | 6/1997 | Larson et al. | ............... | 62/259.2 |
| 6,141,217 A * | 10/2000 | Nakahama et al. | .......... | 361/694 |
| 6,367,542 B1 * | 4/2002 | Chen | ............................ | 165/80.3 |
| 6,449,152 B1 * | 9/2002 | Lin | .............................. | 361/697 |
| 6,714,413 B1 * | 3/2004 | Ghosh et al. | ................. | 361/700 |
| 6,826,049 B2 * | 11/2004 | Chen | ............................ | 361/697 |
| 6,834,713 B2 * | 12/2004 | Ghosh et al. | ............ | 165/104.33 |
| 6,988,536 B2 * | 1/2006 | Lee et al. | ................ | 165/104.33 |
| 7,162,887 B2 * | 1/2007 | Symons | ..................... | 62/259.2 |
| 7,165,413 B2 * | 1/2007 | Symons | ..................... | 62/259.2 |
| 7,224,585 B2 * | 5/2007 | Lee et al. | ..................... | 361/699 |
| 7,475,718 B2 * | 1/2009 | Reyzin et al. | ............ | 165/104.33 |
| 7,571,618 B2 * | 8/2009 | Dessiatoun | ................. | 62/259.2 |
| 2001/0050164 A1 * | 12/2001 | Wagner et al. | ........... | 165/104.33 |
| 2002/0046826 A1 * | 4/2002 | Kao | ........................ | 165/104.33 |
| 2002/0167799 A1 * | 11/2002 | Kawashima et al. | ......... | 361/700 |
| 2004/0070941 A1 * | 4/2004 | Ghosh et al. | ................. | 361/700 |
| 2004/0182099 A1 * | 9/2004 | Hsu | .............................. | 62/259.2 |
| 2004/0196632 A1 * | 10/2004 | Chen et al. | ..................... | 361/697 |
| 2005/0061486 A1 * | 3/2005 | Yang | ........................ | 165/104.33 |
| 2005/0180103 A1 * | 8/2005 | Ku | ................................ | 361/695 |
| 2007/0246195 A1 * | 10/2007 | Bhatti et al. | ............. | 165/104.33 |
| 2007/0246196 A1 * | 10/2007 | Bhatti et al. | ............. | 165/104.33 |
| 2008/0186679 A1 * | 8/2008 | Matsushima et al. | ......... | 361/700 |

* cited by examiner

*Primary Examiner* — Kenneth Rinehart
*Assistant Examiner* — Timothy K Trieu
(74) *Attorney, Agent, or Firm* — Altis Law Group, Inc.

(57) ABSTRACT

A heat dissipation device dissipating heat from a heat-generating electronic element, includes a canister filled with a phase-changeable working fluid, a housing hermetically fixed to a top of the canister and communicating with the canister, a fan located above a top of the housing, an impeller comprising a driving member received in the housing and an axle which extends through a center of the driving member. The axle has a lower end extending downwardly through a bottom of the housing to a center of the top of the canister and an upper end extending upwardly through a top of the housing to engage the fan. The working fluid is heated by the heat-generating electronic element and vaporized into the housing to engage the driving member to rotate and drive the fan to rotate synchronously.

15 Claims, 4 Drawing Sheets

HEAT DISSIPATION DEVICE

BACKGROUND OF THE INVENTION

1. Field of the Invention

The present invention relates generally to a heat dissipation device, and more particularly to a heat dissipation device utilizing a self-circulated fluid system.

2. Description of Related Art

Heat sinks usually remove heat from electronic heat-generating components, such as central processing units (CPUs) etc., to keep the components in stable operation. A typical heat sink comprises a base contacting the heat-generating component to absorb heat therefrom and a plurality of parallel planar fins soldered or adhered to the base. The fins dissipate the heat into ambient temperature. To enhance efficiency, a fan is usually mounted on a top or a side of the heat sink to impel air between the fins.

Conventionally, heat generated by the electronic heat-generating components is dissipated directly into the environment via the heat sink, raising the temperature of the surrounding environment rendering the overall system potentially susceptible to damage, thereby shortening the lifespan thereof. Furthermore, heat transfer from the electronic heat-generating components to the surrounding atmosphere without any reasonable recycling component constitutes energy waste.

What is needed is a heat dissipation device capable of recycling heat energy radiated by a heat-generating component, overcoming the described limitations.

SUMMARY OF THE INVENTION

The present invention relates to a heat dissipation device dissipating heat from a heat-generating electronic element, and includes a canister filled with a phase-changeable working fluid, a housing hermetically fixed to a top of the canister and communicating with the canister, a fan located above a top of the housing, and an impeller constituting a driving member received in the housing and an axle extending through a centre of the driving member. The fan includes a roller having an opening facing the housing and a plurality of blades extending outwardly from a circumference of the roller. The axle has a lower end extending downwardly through a bottom of the housing to a centre of the top of the canister and an upper end extending upwardly through a top of the housing to engage the fan. The working fluid is heated by the heat-generating electronic element and converted to vapor to enter the housing and impel the driving member to rotate and rotate the fan synchronously.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
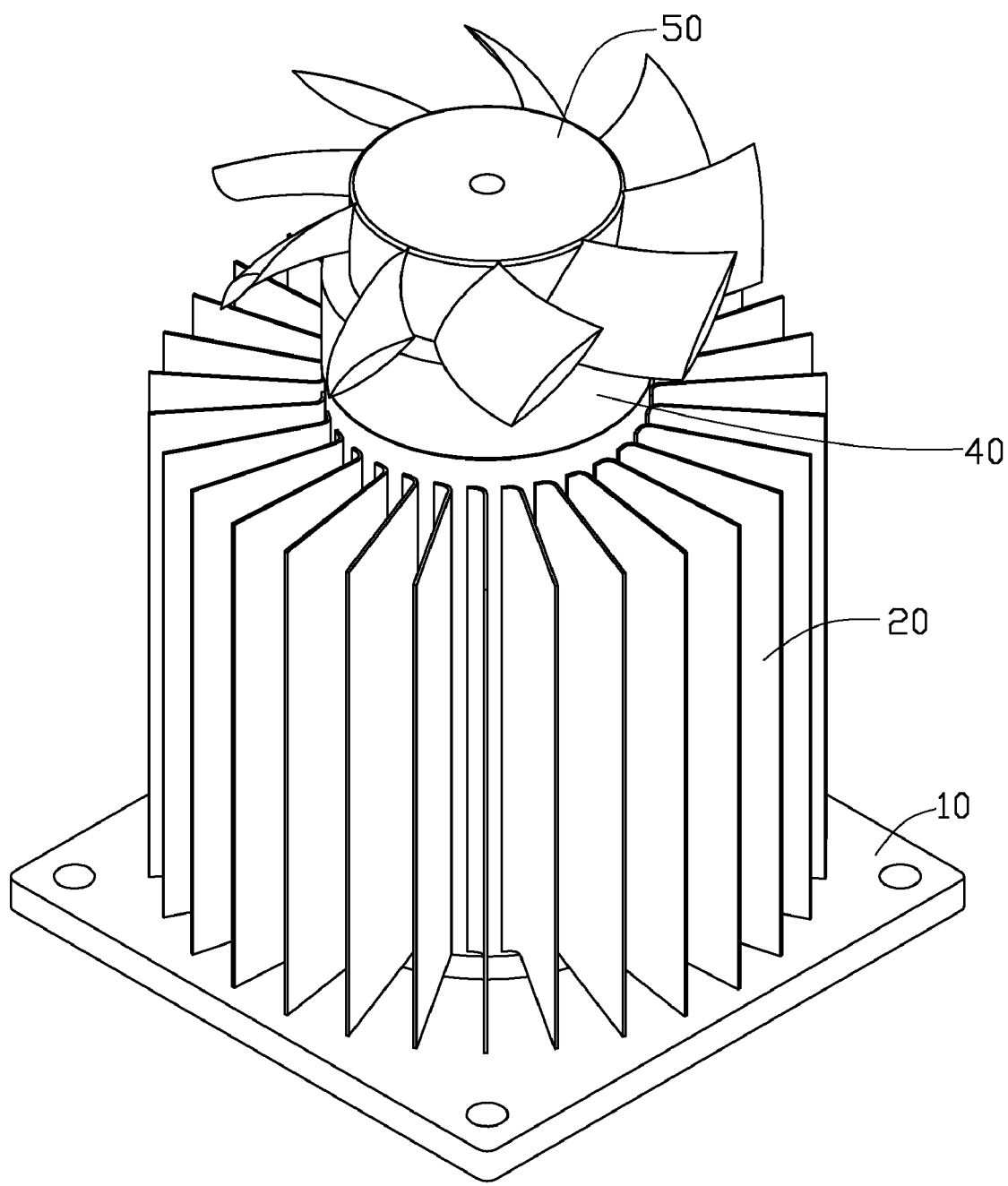
FIG. 1 is an assembled view of a heat dissipation device in accordance with a preferred embodiment of the present invention.
Figure 2:
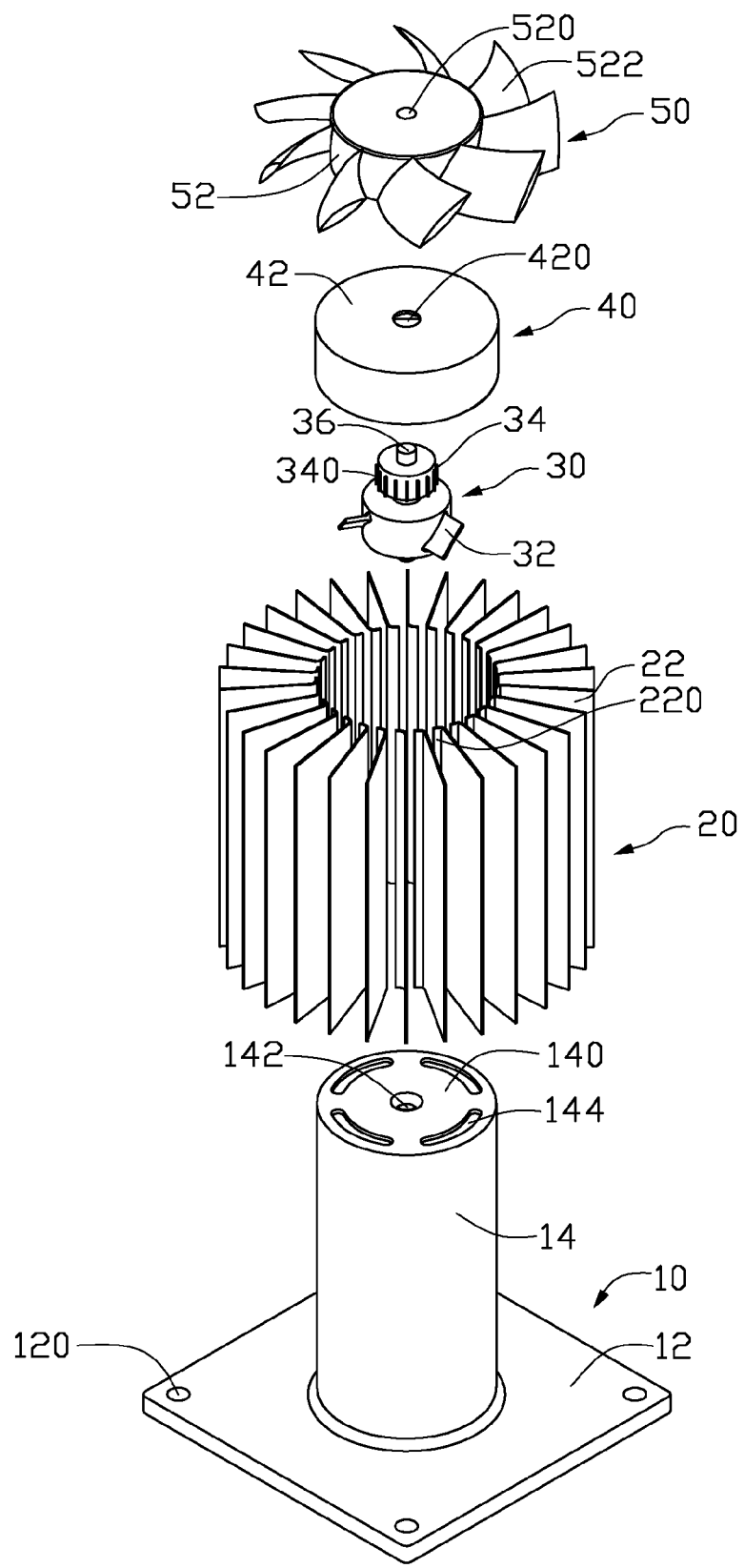
FIG. 2 is an exploded, isometric view of FIG. 1.
Figure 3:
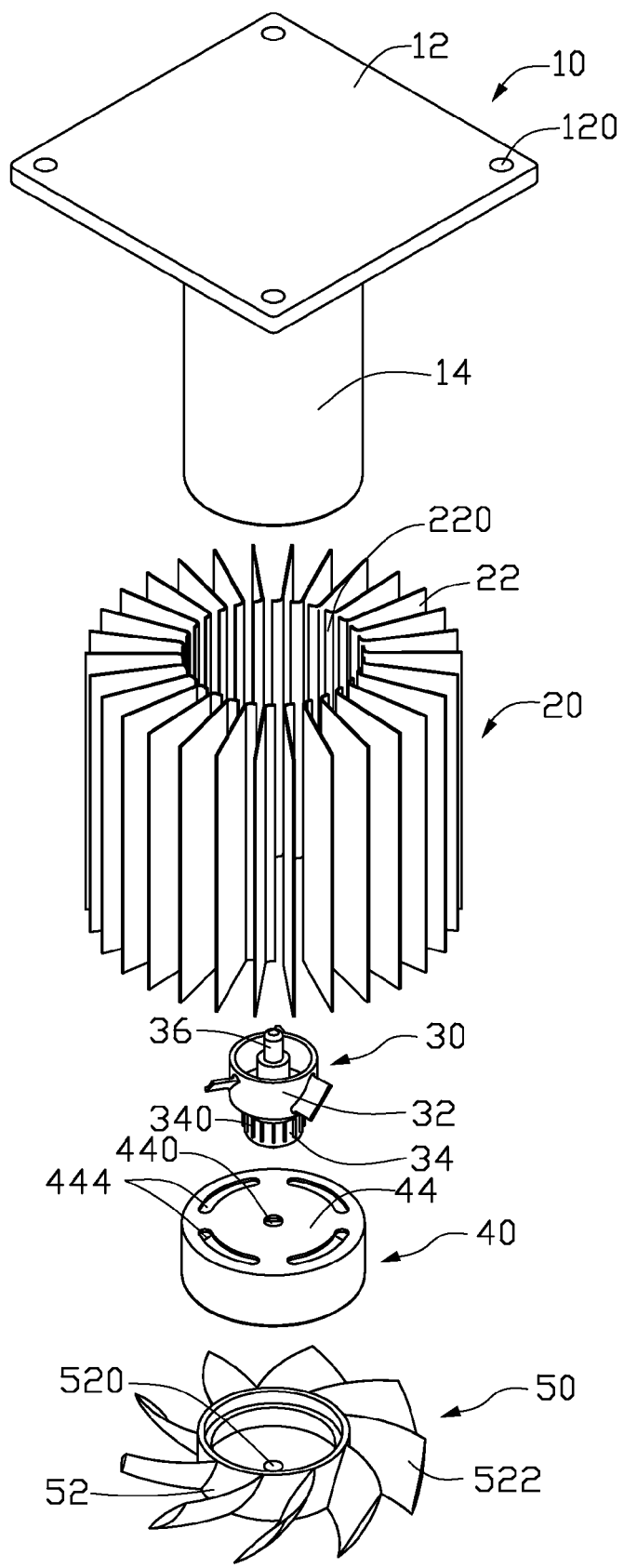
FIG. 3 is an inverted view of FIG. 2.

Referring to FIGS. 1 to 3, a heat dissipation device in accordance with a preferred embodiment of the invention removes heat from a heat-generating component. The heat dissipation device comprises a conductive member 10, a fin unit 20 attached to the conductive member 10, an impeller 30 mounted on a top of the conductive member 10, a housing 40 fixed to the top of the conductive member 10 and receiving a lower portion of the impeller 30 and a fan 50 located above a top of the housing 40 and engaging with an upper portion of the impeller 30.

The conductive member 10 comprises a base plate 12 and a canister 14 vertically mounted on a top of the base plate 12. The base plate 12 is a rectangular flat plate, with a bottom surface contacting the heat generating component and defining four mounting holes 120 in four corners thereof receiving four fasteners (not shown) therein to install the heat dissipation device onto the heat generating component. The canister 14, a vapor chamber, includes a metal casing (not labeled) of highly thermally conductive material such as copper or copper alloy, a phase-changeable working fluid (not shown) contained in the casing and a capillary wick (not shown) arranged on an inner surface of the casing. The canister 14 at a top thereof has a top plate 140 which defines a circular bay 142 in a centre of a top surface thereof. The top plate 140 therein defines a plurality of curved vents 144 along a rim of the top plate 140, symmetrical with each other relative to the bay 142.

The fin unit 20 comprises a plurality of fins 22 attached to a periphery of the canister 14 and extending radially and outwardly from the periphery of the canister 14. The fins 22 are rectangular flake, symmetrical to each other relative to an axis of the canister 14 and have flanges 220 bent perpendicularly from an inner side edge thereof. The flanges 220 are securely fixed to the periphery of the canister 14 by soldering.

The impeller 30 comprises a driving member 32, a rotor 34, and an axle 36 coaxially extending through a centre of the driving member 32 and the rotor 34. The driving member 32, separated from and located under the rotor 34, is received in the housing 40 and has a plurality of blades (not labeled) formed at a circumference thereof. The rotor 34 located above a top of the housing 40 has a plurality of vertical anti-slip tapes 340 projecting outwardly from a circumference thereof for tight engagement of the fan 50. The axle 36 has a lower end which projects downwardly from a bottom of the driving member 32 and is inserted into the bay 142 in the top plate 140 of the canister 14 and an upper end which projects upwardly from a top of the rotor 34 and is joined to the fan 50.

Figure 4:
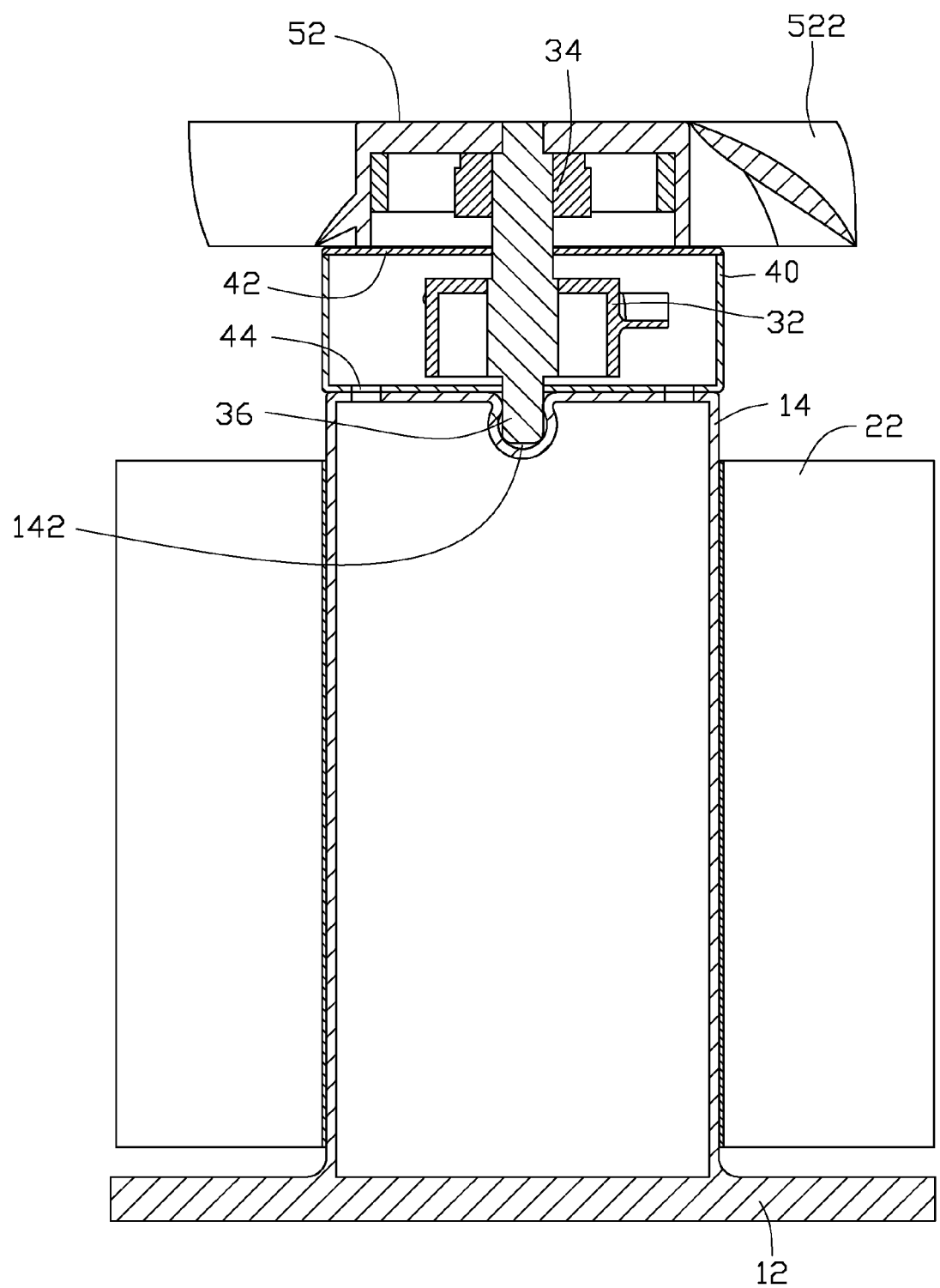
FIG. 4 is a cross section of the heat dissipation device in FIG. 1.

Also referring to FIG. 4, the housing 40 is cylindrical and of a caliber identical to that of the canister 14. The housing 40 has a top panel 42 and a bottom panel 44 parallel and opposite thereto. The top panel 42 is located between the driving member 32 and the rotor 34 of the impeller 30 and defines a through hole 420 in a centre thereof, providing a passage for upward extension of the upper end of the axle 36 of the impeller 30. The bottom panel 44 is attached to a top surface of the top plate 140 of the canister 14 and defines a through hole 440 in the centre thereof for downward extension of the lower end of the axle 36 therethrough into the bay 142 of the top plate 140. The bottom panel 44 therein defines a plurality of vents 444 identical to and respectively communicating with the vents 144 of the top plate 140 of the canister 14.

The fan 50 comprises a roller 52 and a plurality of blades 522 extending outwardly from a circumference thereof. The roller 52 has a caliber slightly smaller than that of the housing 40 and an opening facing the housing 40 and receiving the rotor 34 therein. The roller 52 defines a locking hole 520 in a centre of a top surface thereof for engagingly receiving the upper end of the axle 36 of the impeller 30. The top of the roller 52 is securely fixed to a top of the rotor 34 of the impeller 30 by conventional means such as adhering, clipping and screwing.

Particularly referring to FIG. 4, in assembly of the heat dissipation device, a bottom surface of the bottom panel 44 of the housing 40 is hermetically attached to a top surface of the top plate 140 of the canister 14 with the vents 144, 444 communicating with each other. The through hole 440 is aligned with the bay 142. The driving member 32 of the impeller 30 is sealed in the housing 30, while the rotor 34 of the impeller 30 located above the housing 40 is sealed in the roller 52 of the fan 50, the lower end of the axle 36 is positioned in the bay 142 of the top plate 140 of the canister 14 and the upper end of the axle 36 is locked in the locking hole 520 of the fan 50. In some embodiments of the present invention, the anti-slip tapes 340 engages an inner sidewall of the roller 52 of the fan 50 to rotate the roller 52 synchronously. In some embodiments of the present invention, the top end of the axle 36 may be secured in the locking hole 520 of the fan 50 by adhering or integral connection to a centre of the top of the roller 52 of the fan 50, whereby the fan 50 is coaxially connected with the impeller 30.

In use of the heat dissipation device, the working fluid in the canister 14 is heated by the heat generating component contacting a bottom surface of the base plate 12 below the canister 14 and vaporized. As a result of increased air pressure in the canister 14 as the working fluid vaporizes, the working fluid in vapor form moves toward and through the vents 144, 444 of the top plate 140 of the canister 14 and the bottom panel 44 of the housing 40 and then reaches the blades of the driving member 32. The vaporized working fluid flow rotates the blades of the driving member 32, and the fan 50 securely locked to the upper end of the axle 36 of the impeller 30 is correspondingly rotated synchronously with the impeller 30. The rotating fan 50 generates an airflow toward the fins 22 to dissipate heat from the fins 22; thus, generated heat is reasonably reused to enhance heat dissipating efficiency of the heat dissipation device. In addition, the working fluid in vapor form condenses to liquid form when engaging the blades of the driving member 32, and is then wicked back to a lower portion of the canister 14 via capillary action in the canister 14 to resume circulation.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for dissipating heat from a heat-generating electronic element, the heat dissipation device comprising:
    a canister filled with a phase-changeable working fluid and adapted for receiving heat from the heat-generating electronic component;
    a housing hermetically fixed to a top of the canister and communicating with the canister;
    a fan located above a top of the housing, comprising a roller having an opening facing the housing and a plurality of blades extending outwardly from a circumference of the roller; and
    an impeller comprising a driving member received in the housing and an axle extending through a centre of the driving member, with a lower end extending downwardly through a bottom of the housing to a centre of the top of the canister and an upper end extending upwardly through a top of the housing to engage the fan;
    wherein the impeller further comprises a rotor mounted on the axle, the rotor is received in the roller of the fan and has a plurality of vertical anti-slip tapes projecting outwardly from a circumference thereof, the anti-slip tapes of the rotor engage an inner sidewall of the roller, a top of the rotor engages a top of the roller, and the fan is rotated by the impeller via the rotor; and
    wherein when the working fluid is heated by the heat-generating electronic element and vaporized to move into the housing, the driving member is impelled to rotate by the vaporized working fluid and correspondingly rotates the fan synchronously.

2. The heat dissipation device of claim 1, wherein the upper end of the axle of the impeller engages a top of the roller, and the fan is rotated by the impeller via the axle.

3. The heat dissipation device of claim 2, wherein a centre of the top of the roller therein defines a locking hole engagingly receiving the upper end of the axle.

4. The heat dissipation device of claim 1, wherein the canister comprises a top plate which in a centre thereof defines a bay receiving the lower end of the axle.

5. The heat dissipation device of claim 1, wherein the housing comprises a top panel between the fan and the driving member and in the centre thereof defines a through hole receiving the axle, and a bottom panel which in centre thereof defines a through hole, the lower end of the axle extending through the through hole of the bottom panel.

6. The heat dissipation device of claim 5, wherein the bottom panel is hermetically attached to the top of canister and therein defines a plurality of vents respectively communicating with a plurality of corresponding vents defined in the top of the canister.

7. The heat dissipation device of claim 1, further comprising a plurality of fins which extend radially and outwardly from a periphery of the canister and comprise flanges bent perpendicularly from an inner side edge of the fins and attached to the periphery of the canister.

8. The heat dissipation device of claim 1, wherein the canister is vertically mounted on a centre of a base plate which defines a plurality of mounting holes in its corners.

9. A heat dissipation device adapted for dissipating heat from a heat-generating electronic element, comprising:
    a canister filled with a phase-changeable working fluid;
    a housing hermetically fixed to a top of the canister and communicating with the canister;
    a fan located above a top of the housing, comprising a roller having an opening facing the housing and a plurality of blades extending outwardly from a circumference of the roller; and
    an impeller comprising a driving member received in the housing, a rotor engagingly received in the roller and an axle which coaxially extends through a centre of the driving member and the rotor and comprises a lower end extending downwardly through a bottom of the housing to a centre of the top of the canister and an upper end extending upwardly through a top of the housing to engage a top of the roller;

wherein the impeller has a plurality of vertical anti-slip tapes projecting outwardly from a circumference of the rotor; the anti-slip tapes of the rotor engaging an inner sidewall of the roller, a top of the rotor engaging a top of the roller; and wherein when the working fluid is heated by the heat-generating electronic element and vaporized into the housing and rotates the driving member, the driving member drives the fan to rotate synchronously.

10. The heat dissipation device of claim 9, wherein a top of the rotor engages a top of the roller.

11. The heat dissipation device of claim 10, wherein a centre of the top of the roller therein defines a locking hole engagingly receiving the upper end of the axle.

12. The heat dissipation device of claim 9, wherein the canister has a top plate which in a centre thereof defines a bay receiving the lower end of the axle.

13. The heat dissipation device of claim 12, wherein the housing comprises a top panel between the rotor and the driving member and in the centre thereof defines a through hole receiving the axle, and a bottom panel which in the centre thereof defines a through hole for the lower end of the axle to extend through to insert into the canister.

14. The heat dissipation device of claim 13, wherein the bottom panel is hermetically attached to the top of canister and therein defines a plurality of vents which respectively communicate with a plurality of corresponding vents defined in the top of the canister.

15. The heat dissipation device of claim 9, further comprising a plurality of fins which extend radially and outwardly from a periphery of the canister and comprise flanges bent perpendicularly from an inner side edge of the fins and attached to the periphery of the canister.

* * * * *

UNITED STATES PATENT AND TRADEMARK OFFICE
CERTIFICATE OF CORRECTION

PATENT NO. : 8,245,765 B2  
APPLICATION NO. : 12/200874  
DATED : August 21, 2012  
INVENTOR(S) : Shi-Wen Zhou and Chun-Chi Chen Page 1 of 1

It is certified that error appears in the above-identified patent and that said Letters Patent is hereby corrected as shown below:

Please replace Item (73) regarding "Assignees" on the Title page of the Patent with the following:

(73) Assignees: Fu Zhun Precision Industry (ShenZhen) Co., Ltd., Shenzhen, Guangdong Province (CN); Foxconn Technology Co., Ltd., Tu-Cheng, New Taipei (TW)

Signed and Sealed this
Eleventh Day of March, 2014

Michelle K. Lee
*Deputy Director of the United States Patent and Trademark Office*